United States Patent [19]

Toda et al.

[11] 4,047,115
[45] Sept. 6, 1977

[54] SAMPLE PULSE GENERATING APPARATUS

[75] Inventors: Koichi Toda, Isehara; Tetsuya Miki; Haruo Yamaguchi, both of Yokosuka, all of Japan

[73] Assignees: Anritsu Electric Co., Ltd.; Nippon Telegraph and Telephone Public Corporation, both of Tokyo, Japan

[21] Appl. No.: 743,347

[22] Filed: Nov. 19, 1976

[30] Foreign Application Priority Data

Nov. 21, 1975   Japan .................................. 50-139993

[51] Int. Cl.² ............................................. H03K 5/18
[52] U.S. Cl. ..................................... 328/151; 328/15
[58] Field of Search ................... 328/151, 15; 307/353

[56] References Cited

U.S. PATENT DOCUMENTS

| 3,654,562 | 4/1972 | Reilly et al. | 328/151 |
| 3,848,586 | 11/1974 | Suzuki et al. | 328/151 X |
| 3,877,022 | 4/1975 | Lehman et al. | 328/151 X |

Primary Examiner—John S. Heyman
Attorney, Agent, or Firm—Flynn & Frishauf

[57] ABSTRACT

A sample pulse generating apparatus is provided having an input signal supply circuit for supply an input signal with a high frequency to be sampled, a saw tooth wave generator for generating a saw tooth wave signal which is in synchronism with the input signal and has lower frequency than that of the input signal, a staircase signal generator for generating a staircase signal of which the voltage level is stepped up in synchronism with the occurrence of the saw tooth wave signal, a voltage comparator for receiving the saw tooth wave signal and the staircase wave signal and comparing them and producing a sampling signal when those signals coincide with each other, and an observation signal generator for generating an observation signal which is analogous in wave shape to the input signal and has lower frequency than that of the input signal, by sampling the input signal by the sampling pulses. The sample pulse generating apparatus further includes a counter for executing the count every occurrence of the sample pulse and a memory for previously storing in the order of the saw tooth wave signal generation the signals each with the magnitude corresponding to the time error of each sampling pulse occurrence due to non-linearity of the saw tooth wave signal and for successively generating digital correction signals each corresponding to the magnitude of each stored signal in response to the digital signal of the counter. The staircase signal to be applied to the voltage comparator is the sum of the output of the counter and the digital correction signal from the memory.

2 Claims, 19 Drawing Figures

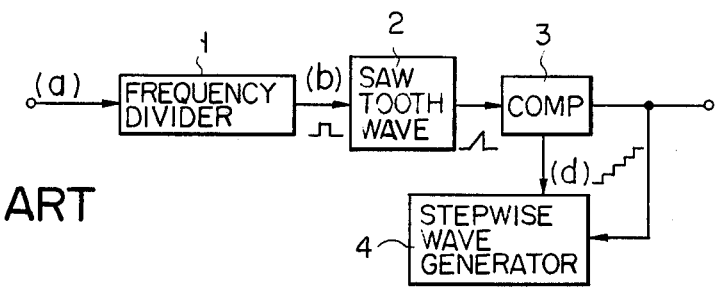
FIG. 1 PRIOR ART
PRIOR ART
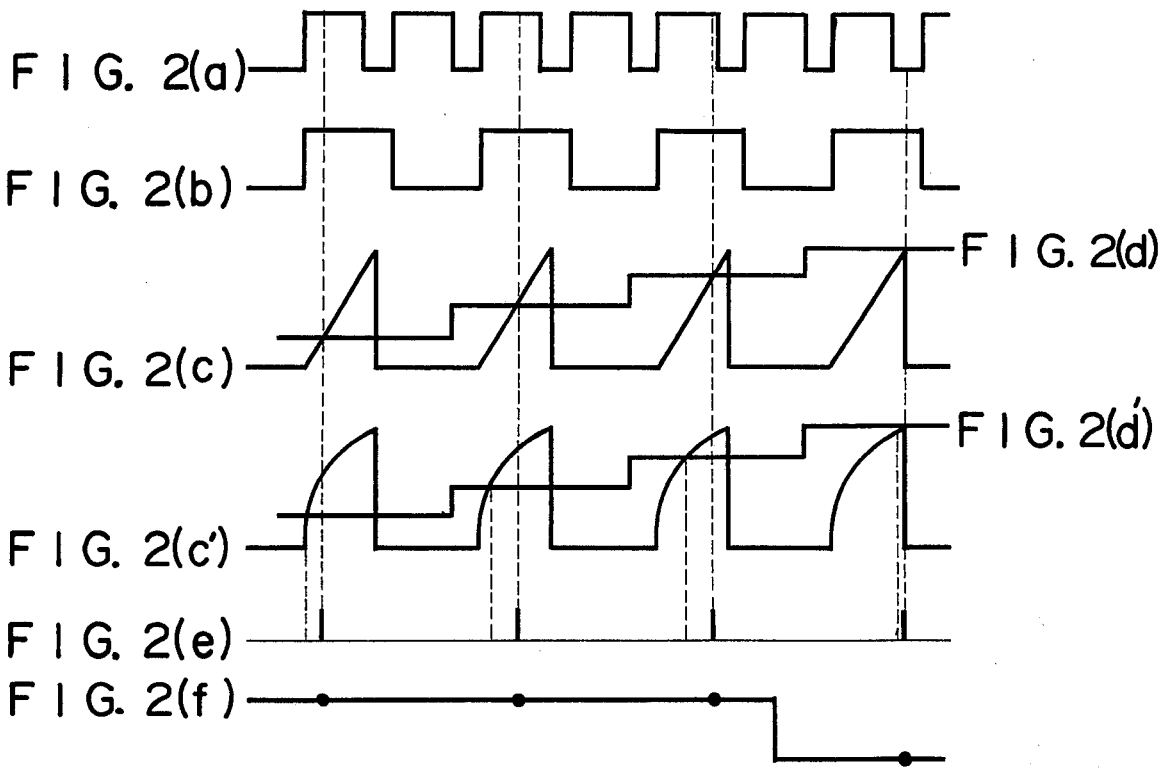
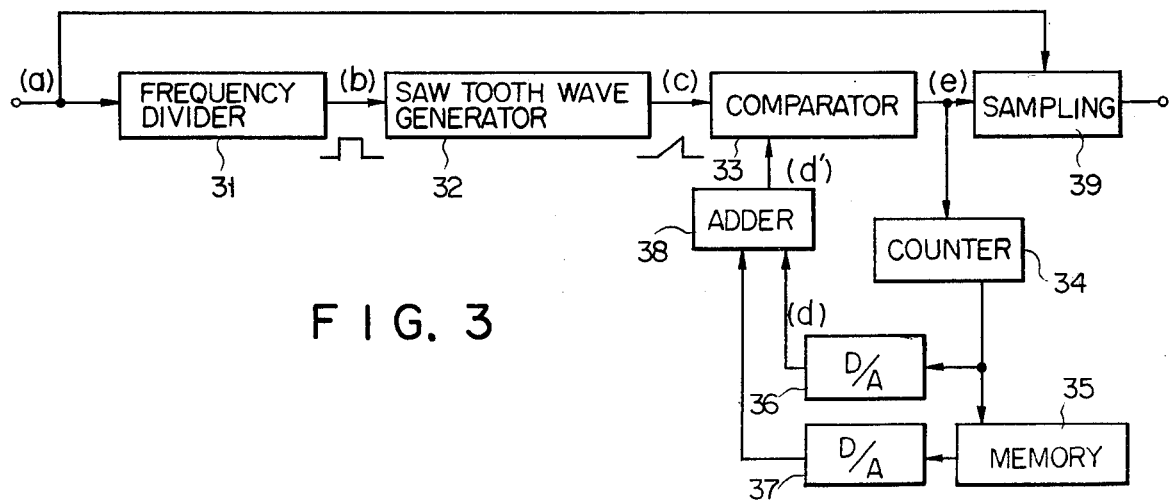
FIG. 3

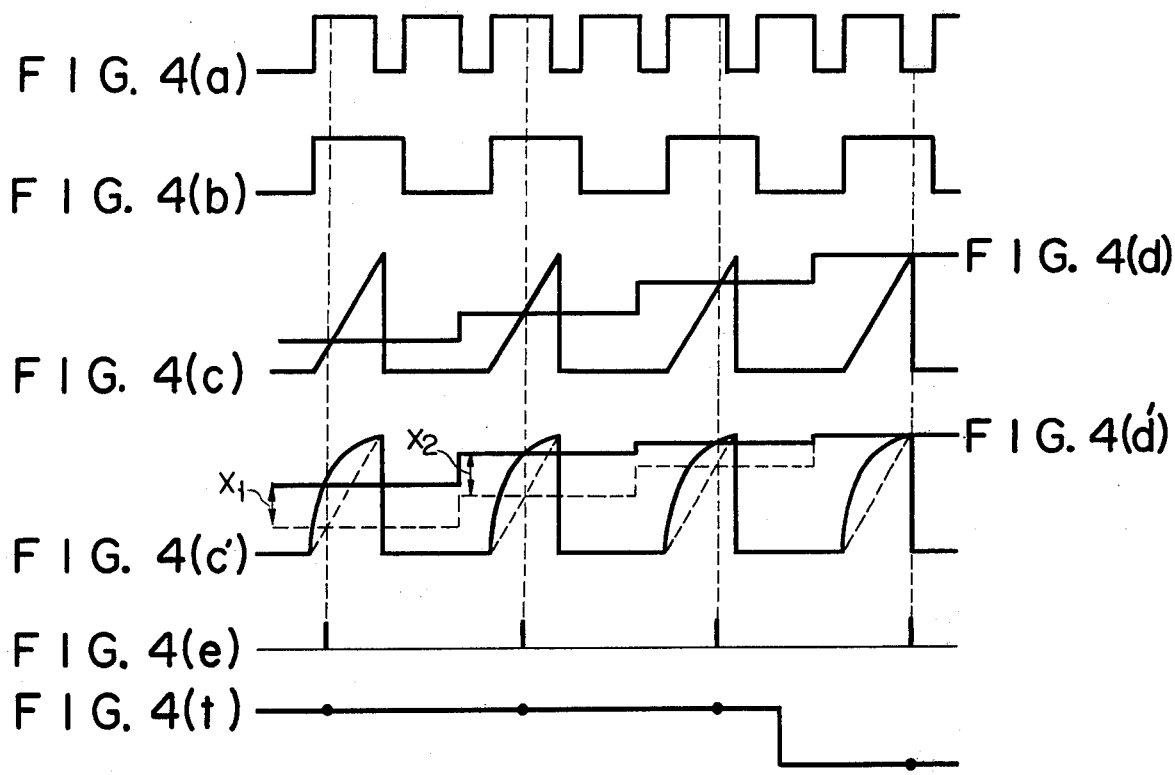
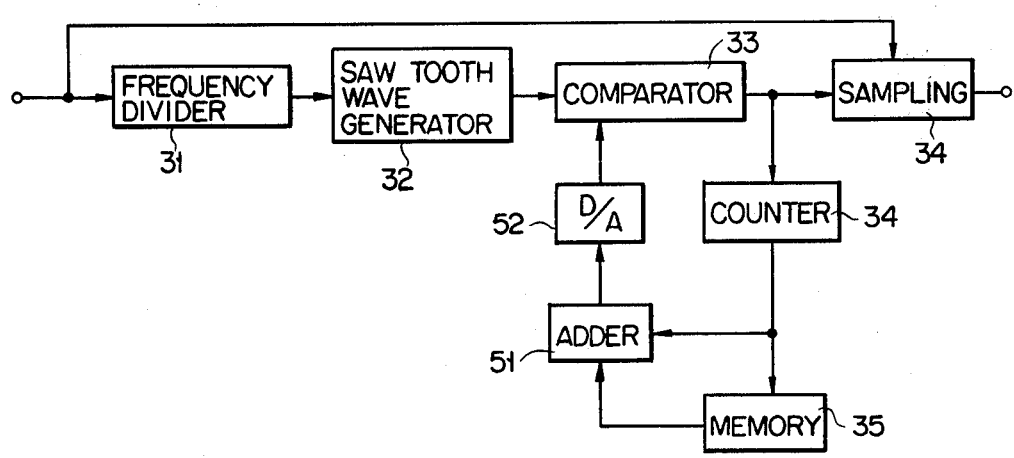

SAMPLE PULSE GENERATING APPARATUS

BACKGROUND OF THE INVENTION

The present invention relates to a sample pulse generating apparatus which is adaptable, for example, for the case where wave forms of high frequency signals are observed through the observation of those analogous ones of low frequency which are transformed from the former wave forms of high frequency through sampling operation.

In observing the wave forms of high frequency signals such as pulse trains, it is common to transform the high frequency signal into a lower frequency signal having the wave form analogous to that of high frequency one, by sampling the high frequency one at a relatively low rate, as found in the sampling oscilloscope. One form of the sample pulse generators for such a sampling operation is shown in FIG. 1.

As shown in FIG. 1, a high frequency pulse train with a wave form (a) (FIG. 2(a)) is inputted into a frequency divider 1 where it is frequency-divided to have a signal wave form (b) of low frequency (FIG. 2(b)). After being frequency-divided, the input signal is applied to a saw tooth wave generating circuit 2 and is transformed into the signal having a saw tooth wave (c) (FIG. 2(c)) in synchronism with the input signal, which in turn is fed to a voltage comparator 3.

A staircase wave generator 4, in response to the signal from the voltage comparator 3, generates a signal having a staircase wave form (d) (FIG. 2(d)) of which the level staircasely increases in synchronism with the saw tooth signal (c). The staircase waveform signal (d) is applied to the voltage comparator 3. The comparator 3 compares the level of the saw tooth wave form signal with that of the staircase waveform signal and produces a pulses (e) (FIG. 2(e)) every time that those signals coincide in level with each other, the pulses being used as sampling pulses. Connecting together those sampled points forms a wave form (f) (FIG. 2(f)) with the enlarged time axis, i.e., a low repition rate, which is analogous to that of the input signal (a). This wave form of low repetition rate is used for observing the input signal form (a) of high frequency.

In such as apparatus, the constancy of the sampling interval on the time axis of the wave form for observation, depends on the staircase precision of the staircase waveform and largely on the linearity of the slant portion of the saw tooth waveform signal. It is to be noted here that the saw tooth waveform shown in FIG. 2(c) is the ideal one, but, in the actual saw tooth wave form, the slant portion is not linear but slightly curved, i.e., the slant thereof in this example is more gentle with time. For this, the sampling pulse occurs, as shown by the dotted line, displaced from the predetermined position indicated by the solid line (see FIG. 2(e)). This causes deterioration of the constancy of the sampling interval.

SUMMARY OF THE INVENTION

Accordingly, an object of the present invention is to provide a sample pulse generating apparatus permitting a correct waveform observation by eliminating the time error of the sample pulse occurence due to the nonlinearity of a saw tooth wave used.

In the present invention for achieving the object mentioned above, a voltage comparator circuit is used which compares a saw tooth wave signal being frequency-divided synchronously signal with high frequency to be sampled, with a staircase wave signal and, when those signals coincide in level with each other, the comparator circuit produces a sampling pulse. A staircase wave signal which is corrected in level by the value corresponding to the time error of the sampling pulse occurence due to the nonlinearity of the saw tooth wave signal, is inputted, as a staircase wave correction input signal, to the voltage comparator circuit. The counter is used for executing the count every occurence of the sample pulse. A memory is further used for previously storing in the order of the saw tooth wave signal generation the signals each with the magnitude corresponding to the time error of each sampling pulse occurence due to the non-linearity of the saw tooth wave signal and for successively outputting the contents of the memory in response to the digital signal of the counter. The staircase wave correction input signal is the sum of the output of the counter and the output of the memory.

The use of such staircase wave correcting input signal enables the voltage comparator to generate sample pulses whose time error in the occurrence is eliminated, thus providing a high performance sample pulse generating apparatus.

Other objects and features of the present invention will be apparent from the following description taken in connection with the accompanying drawings, in which:

BRIEF DESCRIPTION OF THE DRAWING

FIG. 1 shows a block diagram of a conventional sample pulse generating apparatus;

FIG. 2(a) to (f) show waveforms at the respective portions of the sample pulse generating apparatus of FIG. 1;

FIG. 3 shows a block diagram an embodiment of a sample pulse generating apparatus according to the present invention;

FIG. 4(a) to (f) show waveforms at the respective portions of the sample pulse generating apparatus according to the present invention of FIG. 3; and FIG. 5 shows a block diagram of another embodiment of a sample pulse generating apparatus according to the present invention.

DETAILED DESCRIPTION OF THE PREFERRED EMBODIMENTS

Reference is now made to FIG. 3 illustrating in block form an embodiment when the present invention is applied to a waveform observation apparatus, in which reference numeral 31 designates a frequency divider, 32 a saw tooth wave generator, 33 a voltage comparator, 34 a counter, 35 a memory, 36 and 37 digital to analogue D/A converter, 38 an adder and 39 a sampling circuit. The waveforms at the respective portions of the circuit shown in FIG. 3 are shown in FIG. 4.

In operation, an input signal a (FIG. 4(a)) of a pulse train with a repetition frequency is applied to a frequency divider 31 where it is frequency-divided to be a signal b (FIG. 4(b)) with lower repetition rate than that of the input signal a (in the case of FIG. 4, half of the input signal repitition rate). Then, the signal b with low repitition rate is fed to the saw tooth wave generator 32 where it is converted into a saw tooth wave signal c (FIG. 4(c)) in synchronism with the signal b, which in turn is transferred to one of the input terminals of the comparator 33. The comparator 33 produces a series of sample pulses e (FIG. 4(e)) which are guided into the counter 34 where the sample pulses are counted. The digital signals fed from the counter 34 are transferred into the D/A converter 36. The converter 36 produces a staircase signal whose level is stepped up one by one every count by the counter 34.

The output of the counter 34 also is fed to the memory 35 which has stored a correction voltage for correcting the time error of the sample pulse occurence due to the non-linearity of the saw tooth wave. FIG. 4(c) shows ideal waveforms of the saw tooth wave generated by the saw tooth wave generator 32, and actual wave forms thereof are shown in FIG. 4(c'). MOre particularly, the memory 35 stores in digital form the voltages $x_1, x_2 \ldots$ each corresponding to the time error of each sampling pulse due to the nonlinearity of the saw tooth wave signal $c'$ (see FIG. 4(c')), when the sampling pulses are sampled through the direct comparison of the actual saw tooth waves $c'$ (FIG. 4(c')) with the staircase signal $d$ (FIG. 4(d)), as in the conventional apparatus of FIG. 1. The memory 35 successively produces the digital signals corresponding to the voltages $x_1, x_2 \ldots$, in response to the output of the counter 34.

The output of the memory 35 is converted into an analogue signal of the staircase correction signal in the D/A converter 37 and then is added to the staircase signal $d$ (FIG. 4(d)) from the D/A converter 36, into the adder 38. The output signal from the adder 38 corresponds to the signal $d'$ (FIG. 4(d')) which is the sum of the staircase signal ($d$) and the voltages $x_1, x_2 \ldots$, i.e., the shadowed portion in FIG. 4. The output signal $d'$ of the adder 38 is fed to the outer input terminal of the comparator 33. Upon receipt of the signal $d'$, the comparator 33 compares the signal $d'$ with the saw tooth wave signal $c'$ (FIG. 4(c')), and produces a sampling pulse $e$ (FIG. 4(e)) every time those signals coincide in level with each other. Thus, the sampling pulse $e$ occurs at the same time as that where the ideal saw tooth wave signal $c$ coincides in level with the staircase signal $d$, thus improving the time precision of the sampling pulse occurrence.

The sampling pulse $e$ is then applied to the sampling circuit 39 where the sampling points are enveloped to form a signal $f$ (FIG. 4(f)) which is analogous in wave shape to the input signal $a$ (FIG. 4(a)) but has a lower repetition rate than that of the input signal $a$. Accordingly, if the signal $f$ if displayed on the display device such as an oscilloscope, the waveform of the input signal may be observed.

In the above-mentioned embodiment, the staircase signal is added to the stepwise correction signal. Alternately, an arrangement shown in FIG. 5 may attain much the same effects. In FIG. 5, the output of the counter 34 is added, in the adder 51, to the output of the memory 35, and the sum of those outputs is converted to an analogue signal, in the D/A converter 52, thereby obtining the staircase signal whose level is controlled.

It is to be noted that, although the adder 51 is used in the heretofor described circuits, the subtraction circuit may be used if the outputs of the counter 34 and the memory 35 are properly set up.

In the above-mentioned embodiments, the saw tooth wave used takes a form that the slope of the slant portion thereof is more gentle with time. However, it may be more steep with time.

As a matter of course, the present invention may be adapted to other apparatuses than the wave form observation.

Various modifications of the disclosed embodiment will become apparent to the person skilled in the art without departing from the spirit and scope of the invention as defined by the appended claims.

What we claim is:

1. A sample pulse generating apparatus having means for generating an input signal with a high frequency to be sampled; means upon receipt of said input signal for generating a saw tooth wave signal which is in synchronism with said input signal and has lower frequency than that of said input signal; means for generating a staircase wave signal of which the voltage level is stepped up in synchronism with the occurence of said saw tooth wave signal; a voltage comparator for receiving said saw tooth wave signal and said staircase wave signal and comparing them and producing a sampling signal when those signals coincide in level with each other; and means for producing an observation signal which is analogous in wave shape to said input signal and has lower frequency than that of said input signal, by sampling said input signal by said sampling pulses, the improvement in which said staircase wave signal generating means includes a counter means for executing a count every time when it receives said sampling pulse from said comparator and a first digital to analogue converter for successively producing staircase signals every time it receives a digital counting output signal generated from said counter means, and said sample pulse generating apparatus further comprises: memory means for previously storing in the order of said saw tooth wave signal generation the signals each with the magnitude corresponding to the time error of said each sampling pulse occurrence due to the nonlinearity of said saw tooth wave signal and for successively generating digital correction signals each corresponding to said magnitude of said each stored signal in response to said digital signal of said counter means; a second digital to analogue converter for successively producing staircase analogue correction signals every time it receives said digital correction signal from said memory means; and summing means for summing said staircase wave signal from said first digital to analogue converter and said staircase wave correcting signal from said second digital to analogue converter and for outputting the summed signal from said summing means to said comparator where it is compared with said saw tooth wave signal.

2. A sample pulse generating apparatus having means for generating an input signal with a high frequency to be sampled, means, upon receipt of said input signal, for generating a saw tooth wave signal which is in synchronism with said input signal and has lower frequency than that of said input signal; means for generating a staircase signal of which the level is stepped up in synchronism with the occurrence of said saw tooth wave signal; a voltage comparator for receiving said saw tooth wave signal and said staircase wave signal and comparing them and producing a sampling signal when those signals coincide in level with each other; and means for producing an observation signal which is analogous in wave shape to said input signal and has lower frequency than that of said input signal, by sampling said input signal by said sampling pulses, the improvement in which said staircase wave signal generating means include a counter means for executing a count every time when it receives said sampling pulse from said comparator and a digital to analogue converting means for successively producing staircase signals every time it receives a digital counting output signal generated from said counter means, and said sample pulse generating apparatus further comprises: memory means for previously storing in the order of said saw tooth wave signal generation the signals each with the magnitude corresponding to the time error of said each sampling pulse occurrence due to the non-linearity of said saw tooth wave signal and for successively generating digital correction signals each corresponding to said magnitude of said each stored signal in response to said digital signal of said counter means, said memory means being disposed between the output terminal of said counter and the input terminal of said digital to analogue converting means; and summing means for summing the digital counting output from said counter means and the digital correction signal from said memory means and feeding the summed signal from said summing means to said digital to analogue converting means.

* * * * *